United States Patent [19]
Rothkop

[11] Patent Number: 6,144,890
[45] Date of Patent: *Nov. 7, 2000

[54] COMPUTERIZED METHOD AND SYSTEM FOR DESIGNING AN UPHOLSTERED PART

[75] Inventor: Jaron Rothkop, Detroit, Mich.

[73] Assignee: Lear Corporation, Southfield, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/962,582

[22] Filed: Oct. 31, 1997

[51] Int. Cl.⁷ .................................................. G06F 19/00
[52] U.S. Cl. ........................................... 700/97; 700/182
[58] Field of Search ................ 395/500.01; 112/470.27; 29/428, 429; 700/97, 98, 101, 119, 118, 131, 134, 135, 182

[56] References Cited

U.S. PATENT DOCUMENTS

| | | | |
|---|---|---|---|
| 4,888,713 | 12/1989 | Falk | 345/425 |
| 4,937,768 | 6/1990 | Carver et al. | 395/500.01 |
| 5,016,183 | 5/1991 | Shyong | 364/470.02 |
| 5,107,444 | 4/1992 | Wu | 345/419 |
| 5,119,309 | 6/1992 | Cavendish et al. | 364/474.24 |
| 5,175,806 | 12/1992 | Muskovitz et al. | 345/425 |
| 5,218,671 | 6/1993 | Liao et al. | 345/431 |
| 5,222,206 | 6/1993 | Liao | 345/431 |
| 5,231,749 | 8/1993 | Hutchison | 29/407.1 |
| 5,255,352 | 10/1993 | Falk | 345/425 |
| 5,370,692 | 12/1994 | Fink et al. | 623/16 |
| 5,402,582 | 4/1995 | Raab | 33/503 |
| 5,412,880 | 5/1995 | Raab | 33/503 |
| 5,414,647 | 5/1995 | Raab | 702/167 |
| 5,448,687 | 9/1995 | Hoogerhyde et al. | 345/425 |
| 5,491,643 | 2/1996 | Batchelder | 395/500.01 |
| 5,510,977 | 4/1996 | Raab | 364/167.12 |
| 5,587,913 | 12/1996 | Abrams et al. | 364/468.26 |
| 5,687,662 | 11/1997 | Kawasaki | 112/475.08 |
| 5,732,641 | 3/1998 | Kawasaki | 112/470.07 |

*Primary Examiner*—William Grant
*Assistant Examiner*—Kidest Bahta
*Attorney, Agent, or Firm*—Brooks & Kushman P.C.

[57] ABSTRACT

A method and system are provided for designing an upholstered part such as an automotive vehicle seat utilizing a functional, interactive computer data model wherein patterns useful for reproduction of covering material and padding of the seat are generated from a user-modified version of the data model. The data model includes frame and vehicle data, ergonomic constraint data, package requirement data, plastic trim data, restraint system data, and/or seat suspension data. The system includes a graphical display on which graphical representations of the seat are displayed including a final graphical representation which is a photo-realistic, high resolution image of the seat's appearance. The high resolution image depicts most aspects of the seat's final appearance including production-intent fabrics and coverings, plastic grains, trenches and/or styles of sewing. The patterns generated from the modified data model are useful in manufacturing a prototype of the seat thereby significantly shortening the design development cycle of the seat.

49 Claims, 6 Drawing Sheets

Fig. 7

COMPUTERIZED METHOD AND SYSTEM FOR DESIGNING AN UPHOLSTERED PART

TECHNICAL FIELD

This invention relates to computerized methods and systems for designing an upholstered part such as an automotive vehicle seat.

BACKGROUND ART

Until relatively recently, car seat designs were relatively simple and flat. These simple designs reflected the level of attention paid by designers to the interior of the car. Seats were relatively simple to design and required only a few prototypes for new design approval before going into production.

However, in the mid-1980's, there was great interest in the design of automotive interiors including seats. Such new seats must be designed ergonomically to provide comfort and styled to provide visual appeal and a distinct appearance. Consequently, seat designs have become much more complex and demanding. New manufacturing technology has been developed to create bolder designs at lower costs. Advances in seat foam, suspension, trim attachment and trim materials have offered designers the flexibility and numerous choices to create the seats that these new interiors demand.

However, the complexity of these new designs has its price: the design development cycle is no longer short or simple. Refining a seat's design means more prototypes need to be built—often dozens. The time required to build such a large number of prototypes and the accompanying seat design approval process stretches to months of reviewing and revising the seat's final appearance.

Hence, there is a need to not only reduce design development time but also allow design flexibility.

Various methods and systems are available for collecting three-dimensional data for digitization of a three-dimensional object. This data can be obtained from non-contact devices such as camera-based systems or fine contact devices such as portable coordinate measuring machines such as disclosed in the Raab U.S. Pat. Nos. 5,402,582; 5,412,880; and 5,510,977. U.S. Pat. No. 5,255,352 discloses various contact and non-contact devices. However, in general, input data for such systems may be obtained from a CAD system; by scanning a physical part, such as by laser scanning; portable coordinate measuring machines; Moray interferometry; data acquisition systems, and the like.

U.S. Pat. No. 5,107,444 discloses a method for converting a three-dimensional image into a two-dimensional flat pattern that is a true representation of the three-dimensional surface of an object. The invention provides a numerical solution that provides minimum deviation from the true solution to the flattening problem in regions of substantial amounts of Gaussian curvature. This is accomplished in a computer-assisted design system by generating a three-dimensional mesh conforming to the topology of the three-dimensional surface and includes lines intersecting at nodal points to define polygonal elements between the nodal points. The polygonal elements are mapped to a location in a two-dimensional flat plane where the polygonal elements share at least one side with other polygonal elements previously mapped to the flat plane. The length of the shared side is distorted to conform to the length of the shared side of the other polygonal element. The distance between corresponding nodal points in the flat plane and on the three-dimensional surface are compared in order to determine the amount of distortion and are adjusted in response to the results of the comparison. This global adjustment is recursively carried out every time a complete row of elements is added to the developing pattern and when the pattern is complete. The patent further describes tools by which the user may apply his or her creativity and experience to make modifications to the pattern piece. The modifications, or cuts, are mapped back to the three-dimensional surface, which is then reflattened in order to determine the effect of the user-initiated modifications.

As addressed in U.S. Pat. No. 5,448,687, it is conventional to model the surface of complex objects, such as automobile seats, by tiling many surfaces together to define the form of the object. For example, an automotive seat bottom, seat back or seat head rest is each typically defined by up to 10 or more different mathematical surfaces. Each surface combined in this manner has its own parameter space and mathematical surfaces do not necessarily define the particular surface region of a three-dimensional object for the purposes of unwrapping and flattening the three-dimensional object into a two-dimensional pattern shape. Where one or more of the surfaces that are tiled together to form the surface region of the three-dimensional object includes multiple non-developable (i.e., having substantial amounts of Gaussian curvature) adjacent surfaces, the ability to find an optimum solution is further complicated.

U.S. Pat. No. 5,448,687 seeks to find the optimum solution noted immediately above by growing a regional mesh on the three-dimensional surface region conforming to the topology of the surface region independent of the surface boundaries. In this manner, the mesh coincides with and spans the mathematical definition of the corresponding surfaces.

U.S. Pat. No. 5,255,352 discloses an algorithm for mapping a surface detail (i.e., bit map) image to a two-dimensional flattened pattern piece representation of the surface and thereafter mapping this representation to a three-dimensional surface. The invention maps color/texture pixels to create a 3-D image on a screen of the system including appropriate curvature and shading.

Other U.S. patents relating to such data manipulation include U.S. Pat. Nos. 4,888,713; 5,016,183; 5,175,806; 5,218,671; and 5,222,206.

The patents to Abrams et al. (U.S. Pat. No. 5,587,913), Ebenstein et al. (U.S. Pat. No. 5,414,647), Pomerantz et al. (U.S. Pat. No. 4,961,154), and Carver et al. (U.S. Pat. No. 4,937,768) generate three-dimensional articles (or images) based on data provided by a CAD system. The patent to Fink et al. (U.S. Pat. No. 5,370,692) is an example of the numerous references dedicated to the production of prosthetic devices using CAD-like systems.

The patent to Cavendish et al. (U.S. Pat. No. 5,119,309) describes a feature-based method of designing automotive inner panels. This system accepts as input a feature based information set and produces a composite of the surface with a user-specified degree of smoothness.

SUMMARY OF THE INVENTION

An object of the present invention is to provide a computerized method and system for designing an upholstered part such as an automotive vehicle seat to significantly reduce the design development cycle of the seat, thereby eliminating the need for multiple prototypes of the seat.

Another object of the present invention is to provide a computerized method and system for integrating the design development cycle of an upholstered part such as an automotive vehicle seat, while maintaining design flexibility.

In carrying out the above objects and other objects of the present invention, a computerized method is provided for designing an upholstered part. The method includes the steps of generating a functional interactive computer data model of the part, displaying an initial graphical representation of the part based on the data model, and modifying the data model based on user commands to obtain a modified data model. The method also includes the steps of displaying a final graphical representation of the part based on the modified data model and generating patterns useful for reproduction of covering material and padding of the part based on the modified data model.

Further in carrying out the above object and other objects of the present invention, a system is provided for designing an upholstered part. The system includes a data input device for inputting part surface data and a memory for storing a functional, interactive computer data model of the part based on the part surface data. The system also includes a computer programmed to receive user commands and modify the data model based on the user commands to obtain a modified data model, a graphical display coupled to the computer for displaying graphical representations of the part including a final graphical representation of the part based on the modified data model, and an output device coupled to the computer to generate patterns useful for reproduction of covering material and padding of the part based on the modified data model.

Preferably, the final graphical representation is a photo-realistic, high resolution image of the part's appearance.

Also, preferably, the part is a seat such as an automotive vehicle seat.

The data model may incorporate frame and vehicle data, ergonomic constraint data, package requirement data, plastic trim data, restraint system data and/or seat suspension data.

The high resolution image of the seat's appearance may include the contour or shape of the seat as well as all production-intent fabrics and coverings, plastic grains, trenches, and/or styles of sewing.

Further in carrying out the above objects and other objects of the invention, another computerized method for designing an upholstered vehicle seat is provided. The method includes the steps of generating a functional interactive computer data model of the vehicle seat, displaying an initial graphical representation of the vehicle seat based on the data model, and modifying the data model based on user commands to obtain a modified data model. The method also includes the steps of displaying a photo-realistic, high resolution image of the vehicle seat's appearance based on the modified data model.

A system is also provided for designing an upholstered vehicle seat. The system includes a data input device for inputting seat surface data, a memory for storing a functional interactive computer data model of the seat based on the seat surface data, and a computer programmed to receive user commands and modify the data model based on the user commands to obtain a modified data model. The system further includes a graphical display coupled to the computer to display graphical representations of the seat including a photorealistic, high resolution image of the vehicle seat's appearance based on the modified data model.

Yet still further in carrying out the above objects and other objects of the present invention, yet another computerized method for designing an upholstered vehicle seat is provided. The method includes the step of generating a functional interactive computer data model of the vehicle seat. The data model includes frame data, vehicle data, ergonomic constraint data, package requirement data, plastic trim data, restraint system data, and seat suspension data. The method also includes the steps of displaying an initial graphical representation of the part based on the data model, modifying the data model based on user commands to obtain a modified data model, and displaying a final graphical representation of the vehicle seat based on the modified data model.

A system is further provided for designing an upholstered vehicle seat. The system includes a data input device for inputting seat surface data, and a memory for storing a functional interactive computer data model of the vehicle seat based on the seat surface data. The data model includes frame data, vehicle data, ergonomic constraint data, package restraint data, plastic trim data, restraint system data, and seat suspension data. The system further includes a computer programmed to receive user commands and modify the data model based on the user commands to obtain a modified data model. The system finally includes a graphical display coupled to the computer to display graphical representations of the vehicle seat including a final graphical representation of the vehicle seat based on the modified data model.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Figure 1:
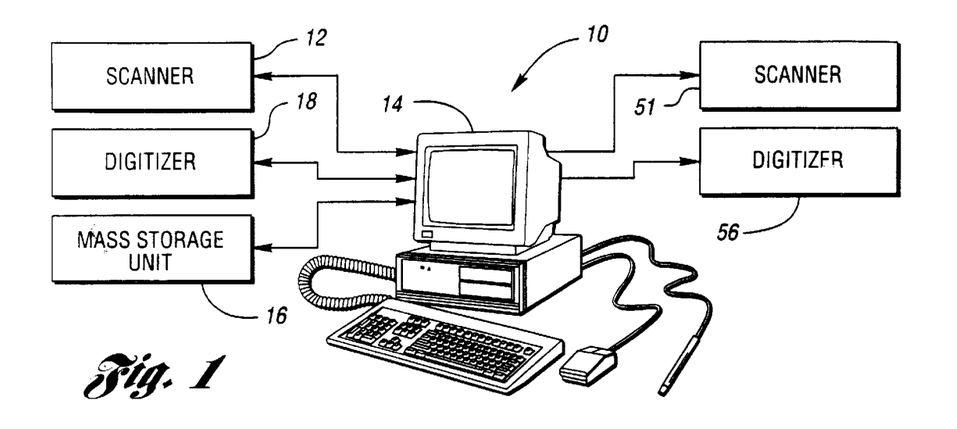
FIG. 1 is a schematic block diagram of a computerized system for designing an upholstered part in accordance with the present invention.
Figure 2:
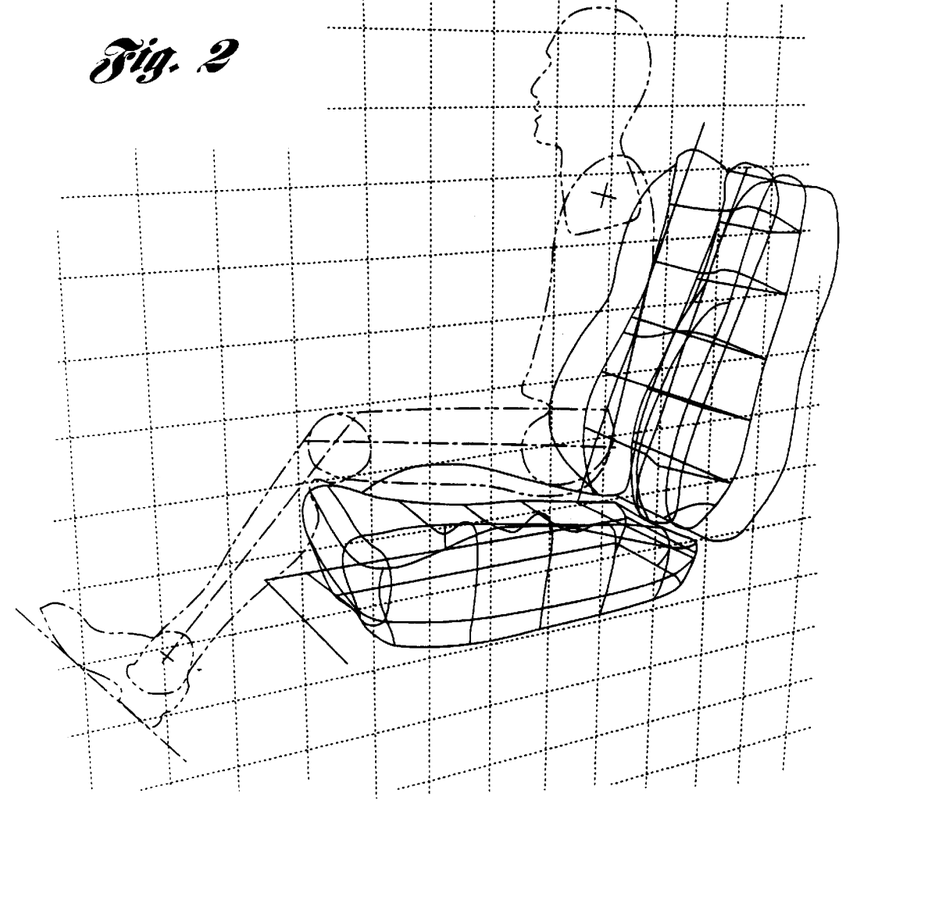
FIG. 2 is a schematic view of a "dummy" seated on a car seat to illustrate package requirements for the seat.

Referring now to the drawing Figures, there is illustrated in FIG. 1 a computerized system, generally indicated at 10, for designing an upholstered part such as an automatic seat, generally indicated at 11 in FIG. 2, constructed in accordance with the present invention. In general, the system 10 includes at least one data input device for inputting part surface data. The data input device may comprise a scanner 12 for scanning a physical part such as an existing seat, frame or vehicle. Preferably, the scanner 12 is a contact scanner due to the surface texture of automotive fabrics. Still preferably, the scanner 12 is a Flashpoint 5000 contact scanner manufactured by Image Guided Technologies as it provides a relatively rapid method of data point acquisition.

The scanner 12 scans the physical part into a host computer or engineering workstation 14. The workstation 14 is preferably programmed to have a graphical user interface for display on a display screen of the workstation 14 which may be a Silicon Graphics, Inc. workstation.

The workstation 14 includes surfacing software stored therein for capturing the point data from the scanner 12 and outputting a NURBS (Non-Uniform Rational B-spline) surface with a deviation or tolerance of no less than 0.5 mm from the scanned points so both the foam and the trim can be developed accurately. A NURBS parametric surface type is preferred since it is widely used throughout the CAD industry. However, other parametric surface types such as parametric splined format can also be used.

Such surfacing software may be Surfacer by Imagewear or Reengineering by Computer Design, Inc. of Grand Rapids, Mich.

Use of the scanner 12 together with the surfacing software allow one to quickly reverse engineer an existing seat. Other data for developing a seat surface includes data representing the seat's H-Point as it is located on the vehicle and the proper design angle. Also, frame data must be imported and located in vehicle position. The seat's overall dimension is established to prevent interference. Finally, ergonomic requirements (i.e. including seat contour) of the seat are established in relation to the H-Point. This creates a virtual, functional, interactive computer data model.

Previously existing CAD data can be imported from an engineering system into the system 10 and stored on a mass storage unit 16 in either NURBS or parametric format. If a number of trim surfaces are present, the trims should be culled to ensure no overlap after translation as described hereinbelow. The system 10 contemplates using any CAD format. The software stored in the mass storage unit 16 can be provided by any CAD software which can export a NURBS surface. The model may be a production tool, a finished part, or the 3-D description of package requirements as illustrated in FIG. 2. Frame data may be in parametric form or engineering solid. The vehicle layout can be imported from the preferred modeling standard of the customer. Product examples are ProEngineer by Parametric Technologies Corp., CATIA by Dessault Systems, CGS or SDRC Ideas.

Alternatively, the system 10 may utilize a digitizer 18 for inputting part surface data by digitizing data off of existing prints or tape drawings. Computer-aided industrial design software creates a NURBS model from the data provided by the digitizer 18. Such styling information may come from conceptual modeling systems. Product examples include AutoStudio by Alias or CDRS or ProDesigner by Parametric Technologies Corporation.

After the system 10 has received all the engineering data, the resulting design must conform to all of the requirements of the particular design. For example, in the example of an automotive seat, the seat must fit the package of the vehicle, the seat frame and suspension, and the comfort criteria of the passenger. If any of these factors change during the design of the seat, they can be updated in the model and the design can be changed accordingly.

The workstation 14 also includes a translator preferably in the form of an IGES translator. The IGES translator converts 3-D surfaces into an IGES model for use by a software package called DesignConcept3-D sold by Computer Design, Inc. This software is functionally described in large part in U.S. Pat. No. 5,255,352. The IGES translator converts all less than 3 degree surfaces to be equal to 3 degree surfaces for use by the DesignConcept3-D software. The IGES model is imported into the DesignConcept3-D software package. In general, trim cover design is described on surfaces and patterns are generated by the DesignConcept3-D software.

Figure 3:
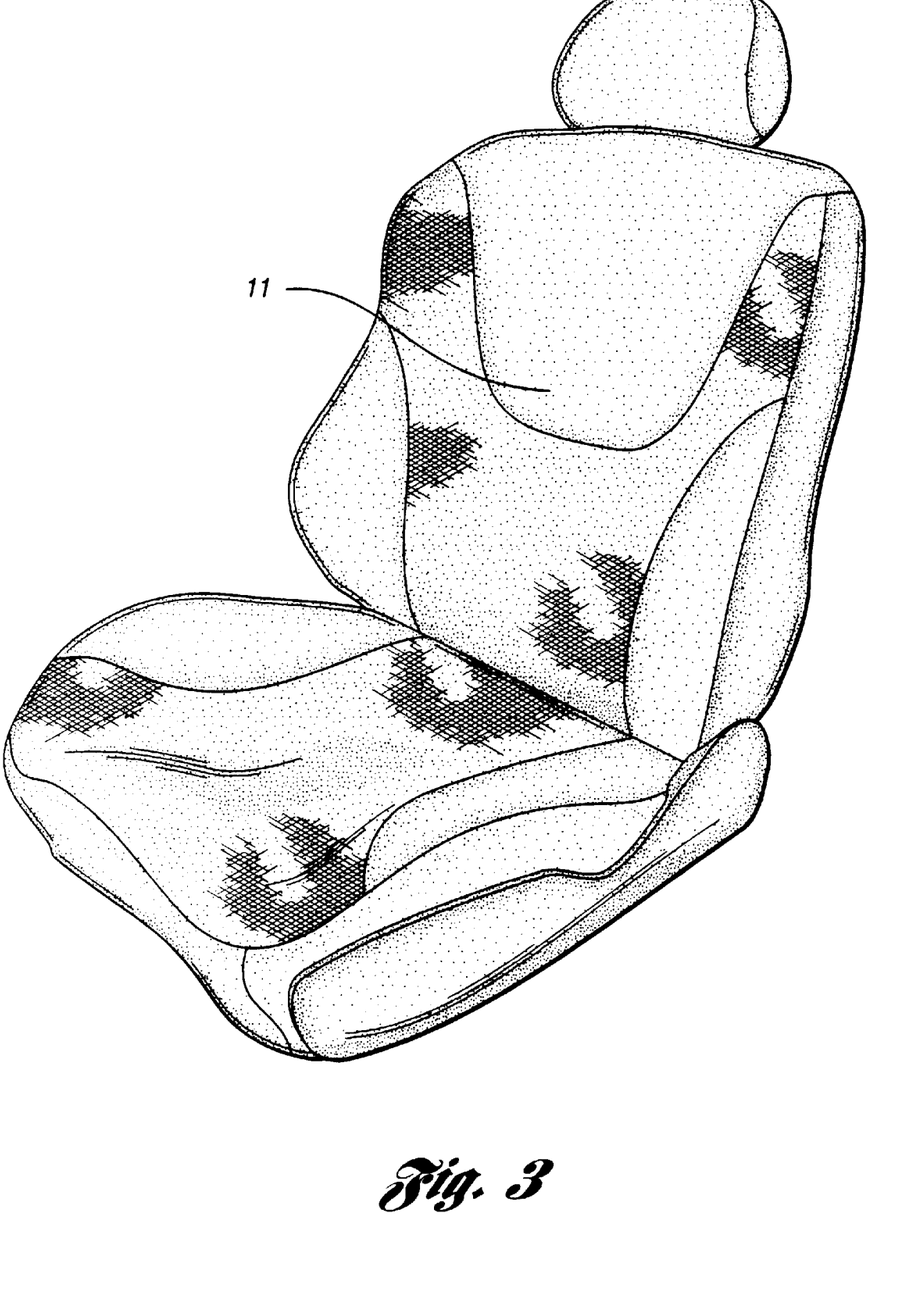
FIG. 3 is an image of a car seat illustrating plastic grains, trenches, styles of sewing, and production intent covering material.
Figure 4:
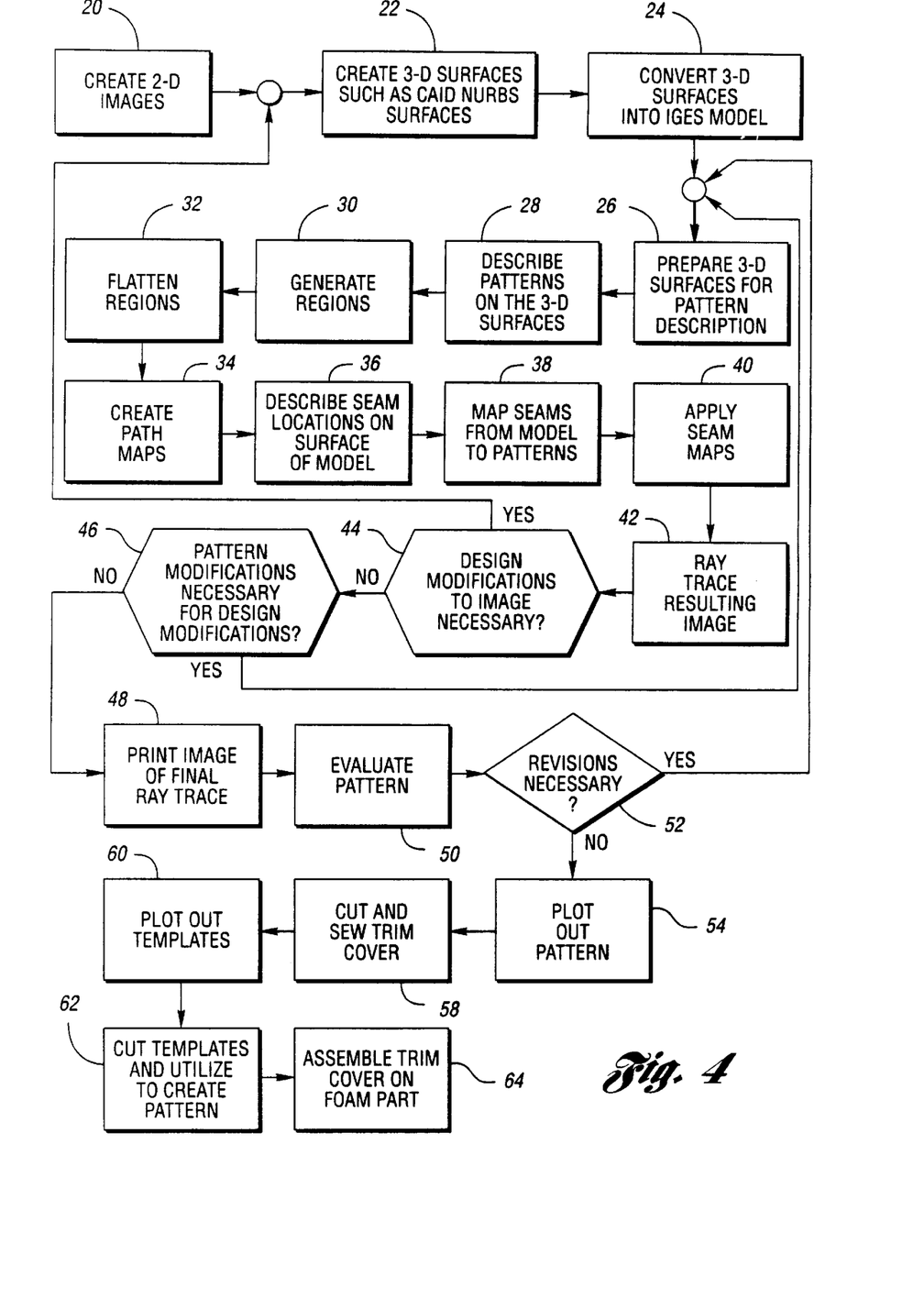
FIG. 4 is a block diagram flow chart illustrating a computerized method for designing an upholstered part in accordance with the present invention.

Referring now to FIG. 4, there is shown a block diagram flow chart illustrating the computerized method of designing an upholstered part such as the vehicle seat 11 of FIG. 3. In general, the method provides a high photorealistic image of the seat 11 of FIG. 2. The image shows the full contour of the seat 11 with production intent fabrics, all of the trim cover details including the type of sewing and additional plastic trim panels 13 in accordance with the present invention.

Initially at block 20, 2-D images such as fabrics are created such as through the use of the scanner 12.

At block 22, 3-D surfaces are created such as CAID NURBS surfaces as previously mentioned.

At block 24, the 3-D surfaces are converted into an IGES model by the IGES translator also, as previously mentioned.

In general, the DesignConcept3-D software performs the steps of blocks 26–42 described herein below. Resulting high resolution images are generated and displayed on the screen of the workstation 14. These images and other information for the model are used as tools for design selection and modification. The following steps 26–42 applied to the operation and settings of the DesignConcept3-D software.

At block 26, 3-D surfaces are prepared for pattern description, surface parameters should be set to no less than 4×4. A preparation depth of less than 15 mm is typically used unless more than 256 meg of memory is available.

At block 28, patterns are described on the surface with hybrid curves which should be enclosed with all endpoints matched. Any curves of a length less than 15 mm should be noted for reduction in link size during region generation (i.e., block 30).

At block 30, regions are generated through the use of settings 1) by curve and vertex; 2) a link length of 10–15 mm; 3) generation by edges and vertices. Regions sharing a common boundary or symmetry should have identical link lengths.

At block 32, the regions are flattened through the use of settings 1) autocontrol="on"; 2) count="on"; 3) by layer= "20", by mesh="100", by total="100". Line maps from 3-D to 2-D should be deactivated. Once the 2-D regions are flattened, a curve should be fitted to the edges for seam mapping (i.e. block 38 below). The best setting for the FitCurve is a tolerance of 0.5 mm. The flattened pattern areas are used to locate the direction and scale of applied fabrics, stitching and trench locations.

At block 34, path maps are created wherein 3-D models of the path maps should be on a 1 to 1 scale. Models recommended are a join seam with a depth of 5 mm, a single stitch, a twin stitch, and a trench seam with a depth of 20 mm. These sizes correspond to recommended settings in mapping menus.

At block 36, seam locations are described. Seam placement should be described on the surface of the model using hybrid or UV curves. The location of the seam lines are described directly on the seat in CDI's CAD-V software.

At block 38, seams are mapped from the model to the patterns using 3-D to 2-D functions in a Converters menu in the software. Tolerance for this conversion and curve fit is 0.5 mm.

At block 40, the seam maps are applied using a "path" setting with a map style of "bump". Recommended scale for the path mapping is 1 per ⅓ mm desired depth (for example, a 10 mm deep seam would have a bump setting 30).

At block 42, the image is retraced by having recommended settings for the raytrace of: bounces=1, jitter=on, anti-alias=partial (2). A perspective view should be used with a FOV of less than 35.

Certain methods of attaching trim to foam are better for certain seat styles. The trim attachment method used for a particular program is typically driven by cost (i.e., what is the cheapest way to attach the trim to the foam and yet maintain design intent).

The method and system of the present invention allow for the critical evaluation of seat contours, thereby permitting the determination of the most cost effective trimming method.

As noted above, the final appearance of the seat includes details such as plastic trim levers and visible mechanical elements such as seat tracks. Also, since different stitching can impact the styling of the seat, these are also shown in the high resolution image formed on the screen of the workstation 14.

Figure 5:
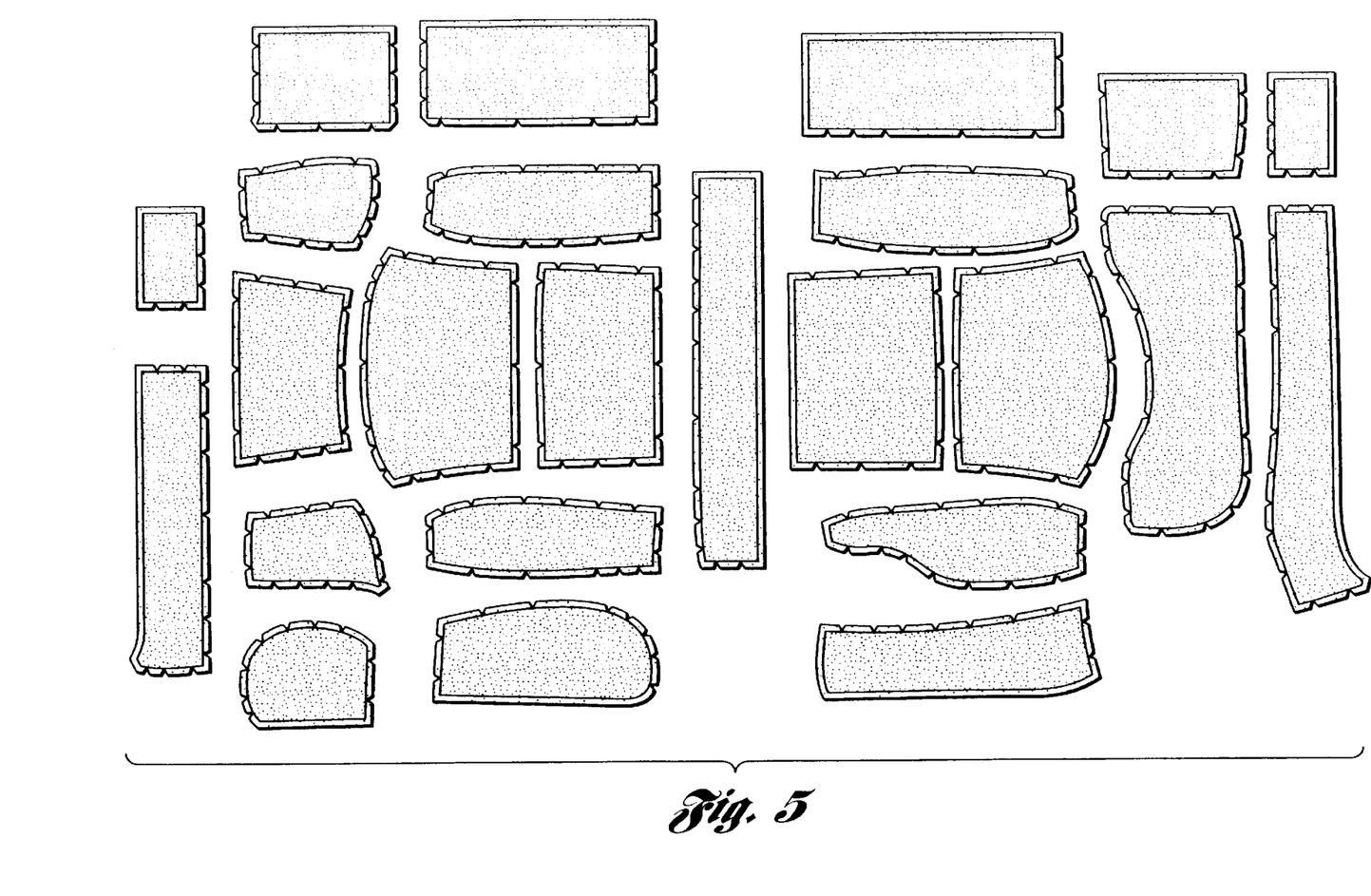
FIG. 5 is a schematic top plan view of a pattern set including notches and desired seam allowances generated in accordance with the present invention for a bench seat.
Figure 6:
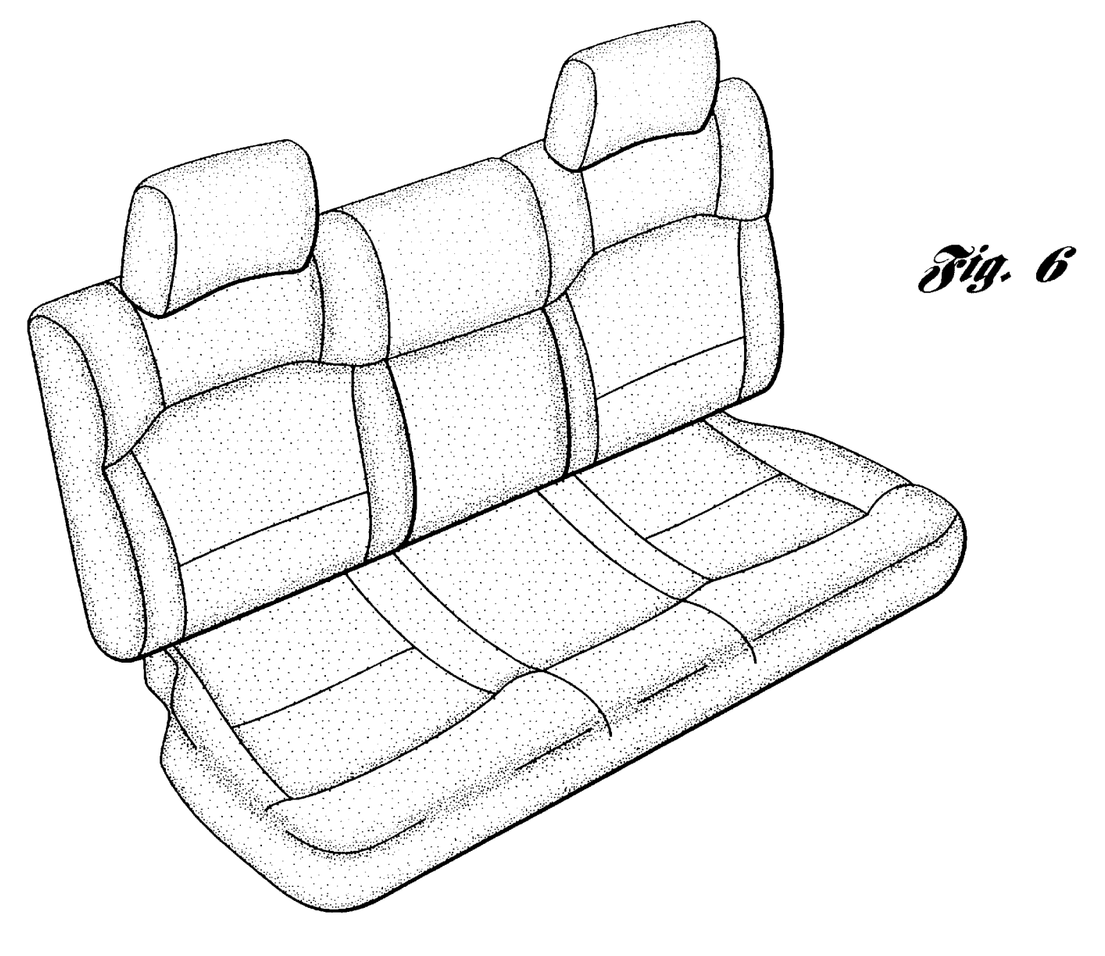
FIG. 6 is an image of a bench seat made from the pattern set of FIG. 5.
Figure 7:
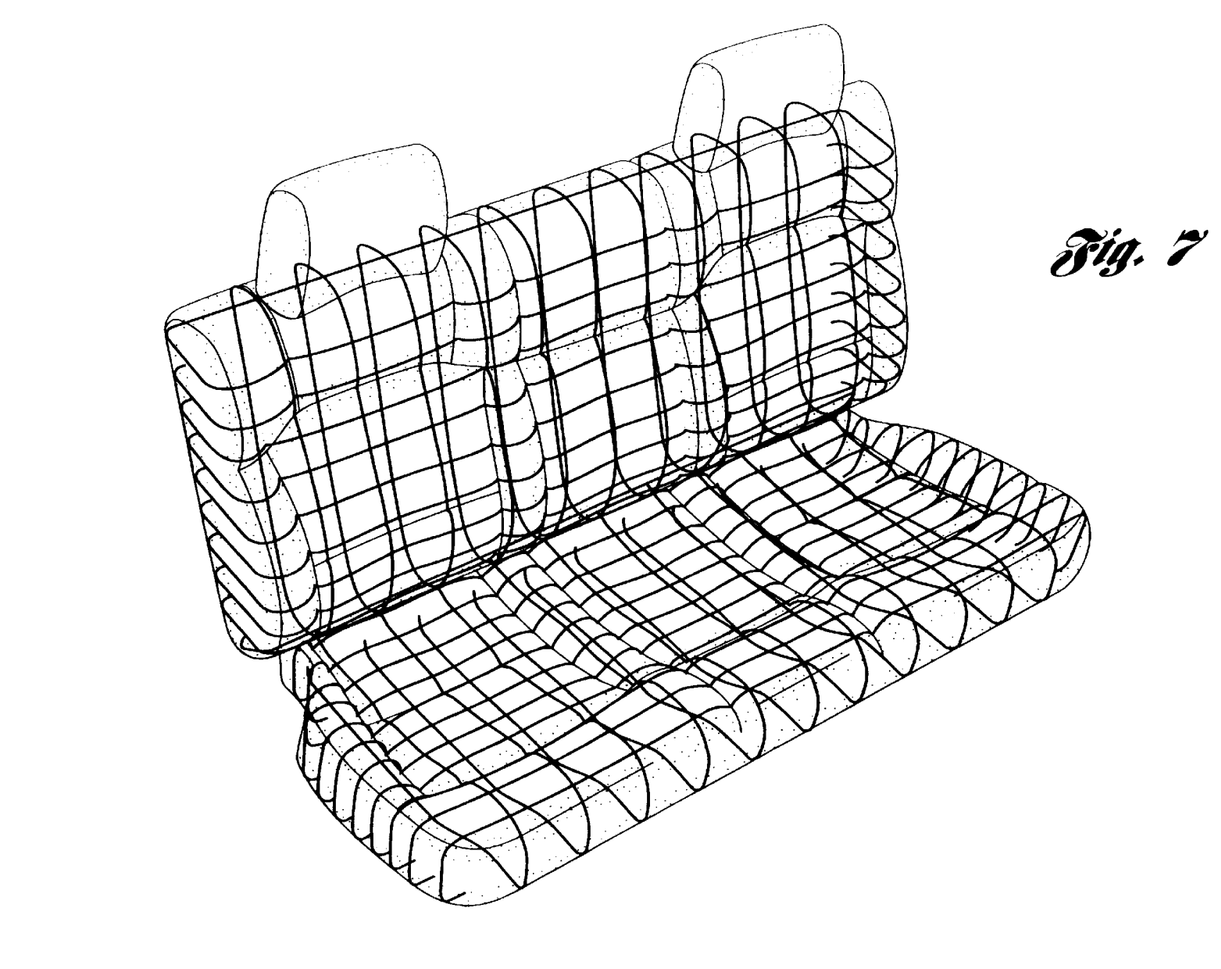
FIG. 7 illustrates a plurality of cross sections of the bench seat of FIG. 6.

As noted below, a complete set of patterns is generated and linked to a particular sewing style, as illustrated in FIG. 5 which shows a pattern set for a bench seat, a photorealistic image of which is shown in FIG. 6 and cross-sections of which are shown in FIG. 7. These patterns can be checked for excess strain to identify trimming and sewing problems. Since this information is available in the design phase, sewing style can be modified to correct the problems and the designer can evaluate how this might change the seat's appearance. When a particular sewing style is selected, the computer flattens and plots out the full set of patterns complete with notches and a desired seam allowance. In this way, full pattern engineering is reduced from multiple hours to just a few minutes.

Referring again to FIG. 4, during display of the high resolution image on the screen of the workstation 14, an operator of the system determines whether design modifications to the image are necessary, as indicated at block 44. If such modifications are necessary, than block 22 is reentered to create new 3-D surfaces.

At block 46, the operator determines whether any pattern modifications are necessary. If such modifications are necessary, then block 26 is reentered. If no such modifications are deemed to be necessary, then block 48 is entered wherein an image of the final raytrace is printed such as on a printer 51 of FIG. 1.

Preferably, the printer 51 is a high resolution printer. It is recommended that the printer 50 be a printer in the Iris range of printers since they provide the highest color fidelity. The recommended media for printing is a flat paper stock.

At block 50, the pattern is again evaluated and at block 52, if revisions are necessary, then block 26 is then reentered.

Also, preferably, the patterns are exported to a digital nesting system for cost and yield information. If the patterns are approved, at block 54, the patterns are plotted out on Mylar on a plotter 56 (i.e. FIG. 1) to be used as templates for a trim cover. The patterns should be refined with a 2-D equals 3-D edge setting. Seam allowances may be applied as necessary as well as key marks in the "mark 5" form. Patterns may be output in IGES or DXF for use by the plotter 56 and should be printed on Mylar for pattern making.

As indicated at block 58, the trim cover is then cut and sewn into a final trim cover.

At block 60, outputs are generated from the data model that describes a solid part. Templates are generated using the "contour" function in the surface inquiry menu of the software. A duplicate of the surface is first created and offset a distance of the trim thickness accounting for laminated padding. Templates are generated by placing the LCS perpendicular to the seat pan angle on the cushion and back frame angle on the back of the seat. Templates are preferably generated approximately every 100 mm. The generated contour lines are then converted to wireframe using the "contour to wireframe" function in the converter's menu. These wire frames are now output for plotting in the IGES or DXF format to the plotter 56.

At block 62, the templates are cut and used to create the seat foam from bulk foam material. The foam panel may be hand skived from the templates or translated into cutter path data and milled out of block foam and then fit to the seat frame.

At block 64, a prototype is made by assembling the trim cover on the resulting seat foam, thereby forming a finished prototype.

As described above, it is shown how digital information regarding trim patterns and foam pad contours is used to make production tooling. The patterns can be nested to yield cost information.

The advantages accruing to the method and system of the present invention are numerous. For example, the method and system of the present invention provide a styling concept which not only allows for digital approval but also generates the material for the final prototype.

Also, while the method and system were described with respect to automotive seats, it can be readily appreciated that the method and system of the present invention can also be utilized for other upholstered parts of an automotive interior or entire vehicle interior assemblies or subassemblies, thereby reducing the need for prototypes on more systems then just seats.

While the best mode for carrying out the invention has been described in detail, those familiar with the art to which this invention relates will recognize various alternative designs and embodiments for practicing the invention as defined by the following claims.

What is claimed is:

1. A computerized method for designing an upholstered part, the method comprising the steps of:

generating a functional interactive computer data model of the part based on data representative of dimensions of the part and user specified design requirements to obtain a modified data model;

displaying an initial graphical representation of the part based on the generated data model;

receiving changes to the data representative of dimensions of the part and the user specified design requirements;

modifying the data model based on the changes to the data representative of dimensions of the part and the user specified design requirements to obtain a modified data model;

displaying a final graphical representation of the part based on the modified data model; and generating patterns useful for reproduction of covering material and padding of the part based on the modified data model.

2. The method as claimed in claim 1 wherein the data representative of dimensions is representative of a seat.

3. The method as claimed in claim 1 further comprising the step of manufacturing a prototype of the part based on the patterns.

4. The method as claimed in claim 1 wherein the user specified design requirements include a comfort criteria parameter to be input when generating the data model.

5. The method as claimed in claim 1 wherein the user specified design requirements include a production-intent covering material parameter to be input when generating the data model.

6. The method as claimed in claim 1 wherein the user specified design requirements include a plastic grains parameter to be input when generating the data model.

7. The method as claimed in claim 1 wherein the user specified design requirements include a trenches parameter to be input when generating the data model.

8. The method as claimed in claim 1 wherein the user specified design requirements include a styles of sewing parameter to be input when generating the data model.

9. The method as claimed in claim 1 wherein the user specified design requirements include a frame data parameter to be input when generating the data model.

10. The method as claimed in claim 1 wherein the part is a vehicle seat and wherein the data representative of dimensions is representative of an in-vehicle position of the vehicle seat.

11. The method as claimed in claim 1 wherein the user specified design requirements include an ergonomic constraint data parameter to be input when generating the data model.

12. The method as claimed in claim 1 wherein the user specified design requirements include a package requirement data parameter to be input when generating the data model.

13. The method as claimed in claim 1 wherein the user specified design requirements include a plastic trim data parameter to be input when generating the data model.

14. The method as claimed in claim 1 wherein the part is a seat and wherein the user specified design requirements include a seat restraint system data parameter to be input when generating the data model.

15. The method as claimed in claim 1 wherein the part is a seat and wherein the user specified design requirements include a seat suspension data parameter to be input when generating the data model.

16. A system for designing an upholstered part, the system comprising:

a data input device for inputting data representative of dimensions of the part and user specified design requirements;

a memory for storing a functional interactive computer data model of the part based on the data representative of dimensions of the part and the user specified design requirements;

a computer programmed to receive changes to the data representative of dimensions of the part and the user specified design requirements and modify the data model based on the changes to obtain a modified data model;

a graphical display coupled to the computer to display graphical representations of the part including a final graphical representation of the part based on the modified data model; and an output device coupled to the computer for generating patterns useful for reproduction of covering material and padding of the part based on the modified data model.

17. The system as claimed in claim 16 wherein the data representative of dimensions is representative of a seat.

18. The system as claimed in claim 17 wherein the seat is an automotive vehicle seat.

19. The system as claimed in claim 16 further comprising means for manufacturing a prototype of the part based on the patterns.

20. The system as claimed in claim 16 wherein the user specified design requirements include a comfort criteria parameter.

21. The system as claimed in claim 16 wherein the user specified design requirements include a production-intent covering material parameter.

22. The system as claimed in claim 16 wherein the user specified design requirements include a plastic grains parameter.

23. The system as claimed in claim 16 wherein the user specified design requirements include a styles of sewing parameter.

24. The system as claimed in claim 20 wherein the part's appearance includes styles of sewing.

25. The system as claimed in claim 16 wherein the user specified design requirements include a frame data parameter.

26. The system as claimed in claim 16 wherein the part is a vehicle seat and wherein the data representative of dimensions is representative of a in-vehicle position of the vehicle seat.

27. The system as claimed in claim 16 wherein the user specified design requirements include an ergonomic constraint data parameter.

28. The system as claimed in claim 16 wherein the user specified design requirements include a package requirement data parameter.

29. The system as claimed in claim 16 wherein the user specified design requirements include a plastic trim data parameter.

30. The system as claimed in claim 16 wherein the part is a seat and wherein the user specified design requirements include a seat restraint system data parameter.

31. The system as claimed in claim 16 wherein the part is a seat and wherein the user specified design requirements include a seat suspension data parameter.

32. A computerized method for designing an upholstered vehicle seat, the method comprising the steps of:

generating a functional interactive computer data model of the vehicle seat based on data representative of dimensions of the seat and user specified design requirements to obtain a modified data model;

displaying an initial graphical representation of the vehicle seat based on the generated data model;

receiving changes to the data representative of dimensions of the vehicle seat and the user specified design requirements;

modifying the data model based on the changes to data representations of dimensions of the vehicle seat and the user specified design requirements to obtain a modified data model; and displaying a photo-realistic, high resolution final graphical representation of the vehicle seat's appearance based on the modified data model; and generating patterns useful for reproduction of covering material and padding of the vehicle seat based on the modified data model.

33. The method as claimed in claim 32 further comprising the step of manufacturing a prototype of the vehicle seat based on the patterns.

34. The method as claimed in claim 32 wherein the user specified design requirements include a production-intent covering material parameter to be input when generating the data model.

35. The method as claimed in claim 32 wherein the user specified design requirements include a plastic grains parameter to be input when generating the data model.

36. The method as claimed in claim 32 wherein the user specified design requirements include a trenches parameter to be input when generating the data model.

37. The method as claimed in claim 32 wherein the user specified design requirements include a styles of sewing parameter to be input when generating the data model.

38. A system for designing an upholstered vehicle seat, the system comprising:

a data input device for inputting seat data representative of dimensions of the seat and user specified design requirements;

a memory for storing a functional interactive computer data model of the vehicle seat based on the seat data representative of dimensions of the seat and the user specified design requirements;

a computer programmed to receive changes to the data representative of dimensions of the seat and the user specified design requirements and modify the data model based on the changes to obtain a modified data model;

a graphical display coupled to the computer to display graphical representations of the seat including a photo-realistic, high resolution image of the vehicle seat's appearance based on the modified data model; and an output device coupled to the computer for generating patterns useful for reproduction of covering material and padding of the vehicle seat based on the modified data model.

39. The system as claimed in claim 38 further comprising means for manufacturing a prototype of the vehicle seat based on the patterns.

40. The system as claimed in claim 38 wherein the the user specific design requirements include a production-intent covering material parameter.

41. The system as claimed in claim 38 wherein the the user specific design requirements include a plastic grains parameter.

42. The system as claimed in claim 38 wherein the the user specific design requirements include a trenches parameter.

43. The system as claimed in claim 38 wherein the the user specific design requirements include a styles of sewing parameter.

44. A computerized method for designing an upholstered vehicle seat, the method comprising the steps of:

generating a functional interactive computer data model of the vehicle seat based on data representative of dimensions of the vehicle seat and user specified design requirements, the data representative of dimensions of the vehicle seat and the user specified design requirements for the data model including frame data, vehicle data, ergonomic constraint data, package requirement data, plastic trim data, vehicle seat restraint system data, plastic grains data, trenches data, styles of sewing data, in-vehicle position of the vehicle seat data, comfort criteria data, production-intent covering material and vehicle seat suspension data;

displaying an initial graphical representation of the part based on the generated data model;

receiving changes to the data representative of dimensions of the vehicle seat and the user specified design requirements;

modifying the data model based on the changes to the data representative of dimensions of the part and the end user specified design requirements to obtain a modified data model; and displaying a final graphical representation of the vehicle seat based on the modified data model; and generating patterns useful for reproduction of covering material and padding of the vehicle seat based on the modified data model.

45. The method as claimed in claim 44 further comprising the step of manufacturing a prototype of the vehicle seat based on the patterns.

46. The method as claimed in claim 44 wherein the final graphical representation is a photo-realistic, high resolution image of the vehicle seat's appearance.

47. A system for designing an upholstered vehicle seat, the system comprising:

a data input device for inputting data representative of dimensions of the vehicle seat and user specified design requirements;

a memory for storing a functional interactive computer data model of the vehicle seat based on the data representative of dimensions of the vehicle seat and the user specified design requirements, the data representative of dimensions of the vehicle seat and user specified design requirements for the data model including frame data, vehicle data, ergonomic constraint data, package restraint data, plastic trim data, vehicle seat restraint system data, plastic grains data, trenches data, styles of sewing data, in-vehicle position of the vehicle seat data, comfort criteria data, production-intent covering material and vehicle seat suspension data;

a computer programmed to receive changes to the data representative of dimensions of the vehicle seat and the user specified design requirements and modify the data model based on the changes to obtain a modified data model; and a graphical display coupled to the computer to display graphical representations of the vehicle seat including a final graphical representation of the vehicle seat based on the modified data model; and an output device coupled to the computer for generating patterns useful for reproduction of covering material and padding of the vehicle seat based on the modified data model.

48. The system as claimed in claim 47 further comprising means for manufacturing a prototype of the vehicle seat based on the patterns.

49. The system as claimed in claim 47 wherein the final graphical representation is a photo-realistic, high resolution image of the vehicle seat's appearance.

* * * * *